United States Patent
Yano

(10) Patent No.: US 6,304,486 B1
(45) Date of Patent: Oct. 16, 2001

(54) SENSING TIME CONTROL DEVICE AND METHOD

(75) Inventor: Masaru Yano, Sunnyvale, CA (US)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/468,422

(22) Filed: Dec. 20, 1999

(51) Int. Cl.[7] .................................................. G11C 16/06
(52) U.S. Cl. ........................... 365/185.22; 365/185.21; 365/185.2; 365/185.12
(58) Field of Search .......................... 365/185.22, 185.2, 365/185.21, 185.11, 185.12

(56) References Cited

U.S. PATENT DOCUMENTS 5,675,537 * 10/1997 Bill et al. ........................ 365/185.22
5,754,475 * 5/1998 Bill et al. .......................... 365/185.2
6,046,934 * 4/2000 Lin .................................. 365/185.21

* cited by examiner

Primary Examiner—Huan Hoang
(74) Attorney, Agent, or Firm—Christie, Parker & Hale, LLP

(57) ABSTRACT

A NAND type flash memory device has a reference bit line and a reference page buffer to control sensing time during program and erase verification operations. Each reference memory cell in the reference bit line is pre-programmed with a reference bit. A set initiation signal triggers detection and latching of the reference bit by the reference page buffer. When the reference bit is latched, an output of the reference page buffer is used as a set signal to trigger the program and erase verification operations of corresponding memory cells.

36 Claims, 7 Drawing Sheets

US 6,304,486 B1

SENSING TIME CONTROL DEVICE AND METHOD

BACKGROUND OF THE INVENTION

This invention relates generally to semiconductor devices, and more particularly to a flash memory device, especially NAND-type flash memory devices with page buffers.

A NAND type flash memory device generally includes a memory cell array, an x-decoder, a y-decoder, a high voltage circuit, a state machine circuit, an address register, a data register and sense amplifier circuit and an I/O register and buffer.

In the memory cell array of a typical NAND type flash memory device, memory cells are organized into memory cell strings. Each memory cell string includes a number of memory cells coupled in series. Generally, each memory cell string contains an equal number of memory cells for any given memory cell array. Thus, the memory cell strings serve as basic building blocks of the memory cell array in a typical NAND type flash memory device.

A number of memory cell strings are coupled in series to form a column. In each column, the memory cell strings are coupled to each other on a bit line. Each bit line is coupled to the data register and sense amplifier circuit. The data register and sense amplifier circuit includes a number of page buffers. One page buffer is coupled to each bit line and is used during read, program and verification operations of the memory cells which are coupled to each bit line.

The memory cell array is also organized into a number of rows, which are also called pages. Each page of memory cells includes an equal number of memory cells. The memory cells on each page are coupled together on a word line. A number of adjacent pages are organized into a memory cell block. Each memory cell block includes as many pages as there are memory cells in the memory cell string. Thus, each memory cell block includes a number of adjacent memory cell strings.

At a core of each memory cell is a floating gate that can be negatively charged with electrons. A charge status of the floating gate indicates whether the corresponding memory cell represents a logic high or a logic low. For example, if the floating gate is in a negatively charged state, the memory cell represents a logic low. If the floating gate is in a discharged state, the memory cell represents a logic high.

During a program operation, electrons are injected into the floating gates of memory cells that are currently in a discharged state but are desired to be in a negatively charged state. During an erase operation, electrons are removed from the floating gates of memory cells that are in a negatively charged state. Thus, a programmed memory cell represents a logic low while an erased memory cell represents a logic high. Generally, memory cells in one memory cell block are erased simultaneously during each erase operation while memory cells in each page are programmed simultaneously during each program operation.

After the memory cells are programmed or erased, they are verified to ensure that programming or erasing, respectively, has been performed correctly. In other words, in case of a program operation, the memory cells are checked during a program verification operation to determine if an adequate number of electrons have been injected into the floating gates of the programmed memory cells. In the case of the erase operation, the memory cells are checked during an erase verification operation to determine if electrons have been successfully removed from the floating gates of the erased memory cells.

During the program and erase verification operations, the page buffers in the data register and sense amplifier circuit are used to read and store the contents of memory cells. Since there is a page buffer associated with each bit line, an entire page is verified at a time during a program verification operation. A verification is performed for an entire erased memory cell block during the erase verification operation since memory cells of a memory cell block containing multiple pages are erased simultaneously.

During the program verification operation a voltage at a threshold voltage node in each page buffer is checked. The voltage at the threshold voltage node varies depending on the charge status of the memory cell whose content is being verified. If the memory cell has been programmed correctly, i.e., if the floating gate of the memory cell has been negatively charged properly, a threshold voltage is reached at the threshold voltage node. If the memory cell has not been programmed correctly, the threshold voltage is not reached.

Due to resistance of the memory cells, bit lines and the page buffers, the threshold voltage is not reached instantaneously even if the memory cell has been programmed correctly. Thus, if a program verification operation is performed too soon following a program operation, an erroneous conclusion that the memory cell has not been programmed properly may be reached. Thus, a set signal, which is activated after a pre-programmed delay, is generally used to initiate the program verification operation. The set signal with the programmed delay is typically generated by a timer sequence in the state machine circuit.

Using a set signal with a pre-programmed delay to initiate the program verification operation presents some difficulties. Since memory cells in different pages have different resistances from the page buffer to the memory cell and from the memory cell to a Vss voltage, a use of a uniform delay that has been pre-programmed for all the memory cells may present problems. Further, a time for the threshold node to reach the threshold voltage also depends on temperature, and it is not always possible to correctly estimate a required duration of the pre-programmed delay.

If the pre-programmed delay is too long, speed of the flash memory device is adversely affected because of an unnecessary additional waiting period. If the pre-programmed delay is too short, the program verification operation may be attempted before the threshold voltage is reached even if the memory cell that is being verified has been programmed correctly. In other words, if the program verification operation is performed too early, the verification may erroneously fail. If it is performed too late, an unnecessary additional delay may slow down the speed of the flash memory device.

SUMMARY OF THE INVENTION

Therefore, the present invention provides a sensing time control device and method that uses a measurement of a pre-programmed reference memory cell to ascertain the time it takes for a threshold voltage node to reach a threshold voltage.

One embodiment of the present invention is a method of performing a program verification operation. A reference memory cell and a memory cell are programmed. A set signal is generated using a content of the reference memory cell. The program verification operation for the memory cell is initiated using the set signal.

Another embodiment of the present invention is a method of performing a program verification operation wherein the reference memory cell is coupled to a reference page buffer and the memory cell is coupled to a data page buffer. The reference page buffer is used to read and store a content of the reference memory cell and the data page buffer is used to read and store a content of the memory cell.

Yet another embodiment of the present invention is a method of performing a program verification operation when a first program verification operation fails. The memory cell is re-programmed and the set signal is re-generated with the content of the reference memory cell. The set signal is used to initiate another program verification operation of the memory cell.

Yet another embodiment of the present invention is a method of performing an erase verification operation. A reference memory cell is programmed and a memory cell is erased. A set signal is generated using a content of the reference memory cell. The erase verification operation for the memory cell is initiated using the set signal.

Yet another embodiment of the present invention is a method of performing an erase verification operation when a first erase verification operation fails. The memory cell is re-erased and the set signal is re-generated with the content of the reference memory cell. The set signal is used to initiate another erase verification operation of the memory cell.

Yet another embodiment of the present invention is a method of performing a program verification operation wherein a plurality of memory cells are programmed.

Yet another embodiment of the present invention is a method of performing an erase verification operation wherein a plurality of memory cells are erased.

Yet another embodiment of the present invention is a method of verifying a content of a memory cell comprising programming a reference memory cell, sensing a content of the reference memory cell and verifying the content of the memory cell when the content of the reference memory cell has been sensed.

Yet another embodiment of the present invention is a method of providing a set signal to a page buffer associated with a memory cell. A reference memory cell coupled to a reference page buffer is programmed. A voltage of a node in the reference page buffer is set based on the content of the reference memory cell. The voltage at the node is provided to the page buffer as the set signal.

Yet another embodiment of the present invention is a sensing time control circuit comprising a reference page buffer and a plurality of data page buffers. The reference page buffer receives a set initiation signal and generates a set signal. The plurality of data page buffers receive the set signal and store contents of a plurality of memory cells. Each of the plurality of data page buffers stores a content of an associated one of the plurality of memory cells.

Yet another embodiment of the present invention is a NAND type flash memory device which includes a memory cell array with a plurality of rows and a plurality of columns of memory cells as well as following components. An x-decoder selects the plurality of rows of memory cells and a y-decoder selects the plurality of columns of memory cells. A data register and sense amplifier circuit reads and programs the plurality of rows and the plurality of columns of memory cells. An I/O register and buffer is coupled to the data register and sense amplifier circuit. The I/O register and buffer provides an external interface of the NAND type flash memory device. A high voltage circuit provides program, read and erase voltages to the x-decoder. A state machine circuit provides control signals to the data register and sense amplifier circuit. An address register provides an address to be decoded to the x-decoder and the y-decoder.

Many of the attendant features of this invention will be more readily appreciated as the same becomes better understood by reference to the following detailed description considered in connection with the accompanying drawings.

DETAILED DESCRIPTION OF THE INVENTION

Figure 1:
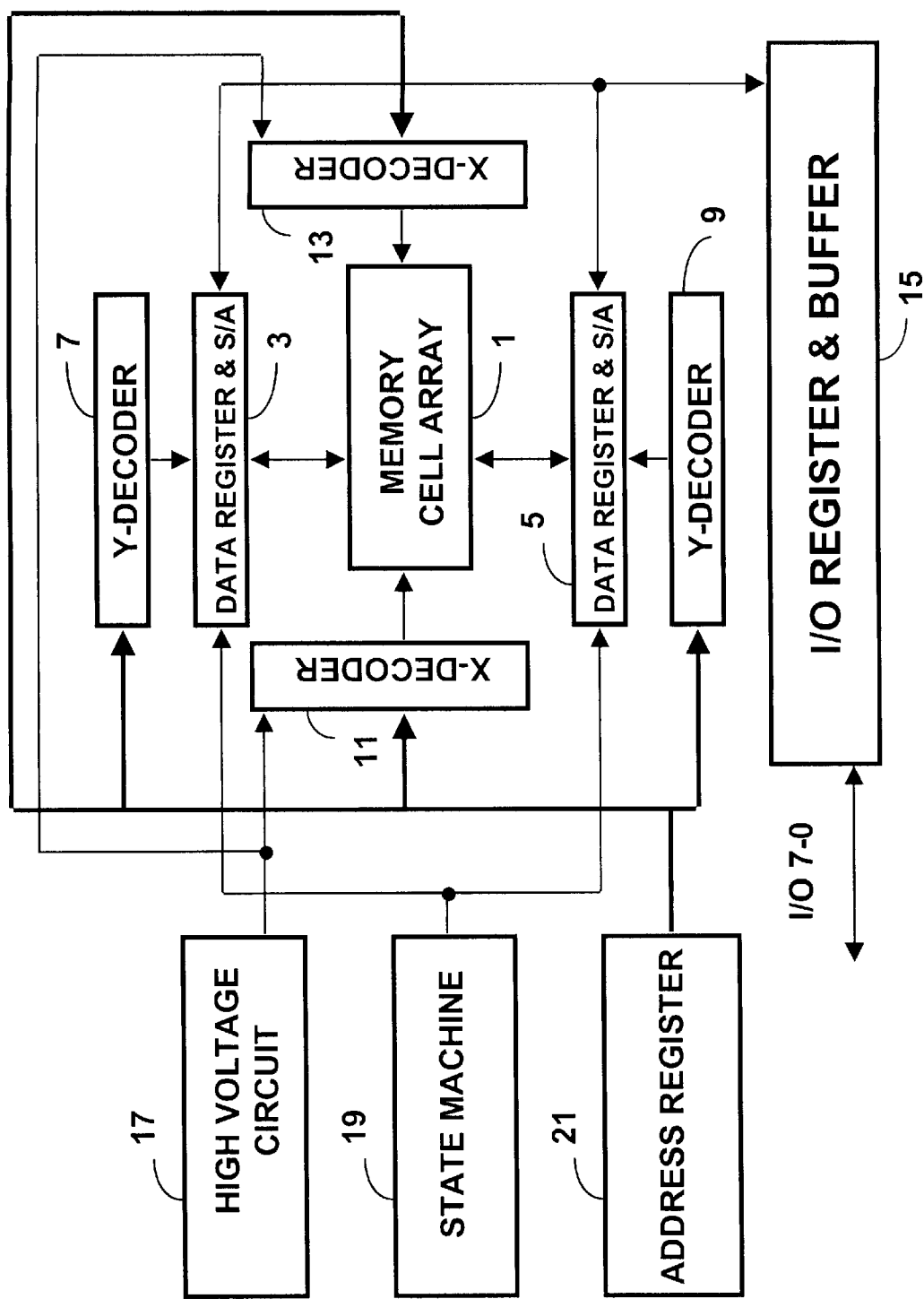
FIG. 1 is a block diagram of a flash memory device using the sensing time control device and method of the present invention.

FIG. 1 is a block diagram of a flash memory device which uses a sensing time control device and method of the present invention. A memory cell array 1 is comprised of rows and columns of memory cells. The rows of memory cells are generally referred to as word lines and the columns of memory cells are generally referred to as bit lines. The memory cells in the memory cell array are addressable with first and second x-decoders 11 and 13 and first and second y-decoders 7 and 9.

The memory cell array includes a number of memory cell blocks, each of which contains a number of rows of memory cells. The first x-decoder is used to select a first group of memory cell blocks while the second x-decoder is used to select a second group of memory cell blocks. For example, the first x-decoder is used to select even numbered memory cell blocks, i.e., memory cell blocks 0, 2, 4, etc. The second x-decoder is used to selected odd numbered memory cell blocks, i.e., memory cell blocks 1, 3, 5, etc.

Similarly, the first y-decoder is used to select a first group of columns of memory cells while the second y-decoder is used to select a second group of columns of memory cells. For example, where n is the number of columns of memory cells in a memory cell array, the first y-decoder is used to select the first group of n/2 columns of memory cells while the second y-decoder is used to select the second group of n/2 columns of memory cells.

The first and second x-decoders and the first and second y-decoders receive memory addresses from an address register 21. The memory addresses are decoded by the first and second x-decoders to select rows of memory cells for read, program, erase and verification operations. The memory addresses are also decoded by the first and second y-decoders to select columns of memory cells for read, program, erase and verification operations.

A high voltage circuit 17 provides voltages to the first and second x-decoders 11 and 13 to apply to selected memory cells. Different levels of voltages are provided to the memory cells for different operations. The levels of voltages which should be provided to the memory cells during different operations are well known in the art.

Similar to the first and second y-decoders 7 and 9, first and second data register and sense amplifier circuits 3, 5 interface, respectively, with first and second groups of columns of memory cells. During a read operation, the first and second data register and sense amplifier circuits read and store data from selected memory cells. The data is transferred from the first and second data register and sense amplifier circuits to an I/O register and buffer 15 to be transferred out of the flash memory device. During a program operation, the first and second data register and sense amplifier circuits receive data to be written to selected memory cells from the I/O register and buffer 15. A state machine circuit 19 supplies control signals to the data register and sense amplifier circuits 3 and 5. The state machine circuit controls the timing of signals which are used during the program verification and the erase verification operations.

Figure 2:
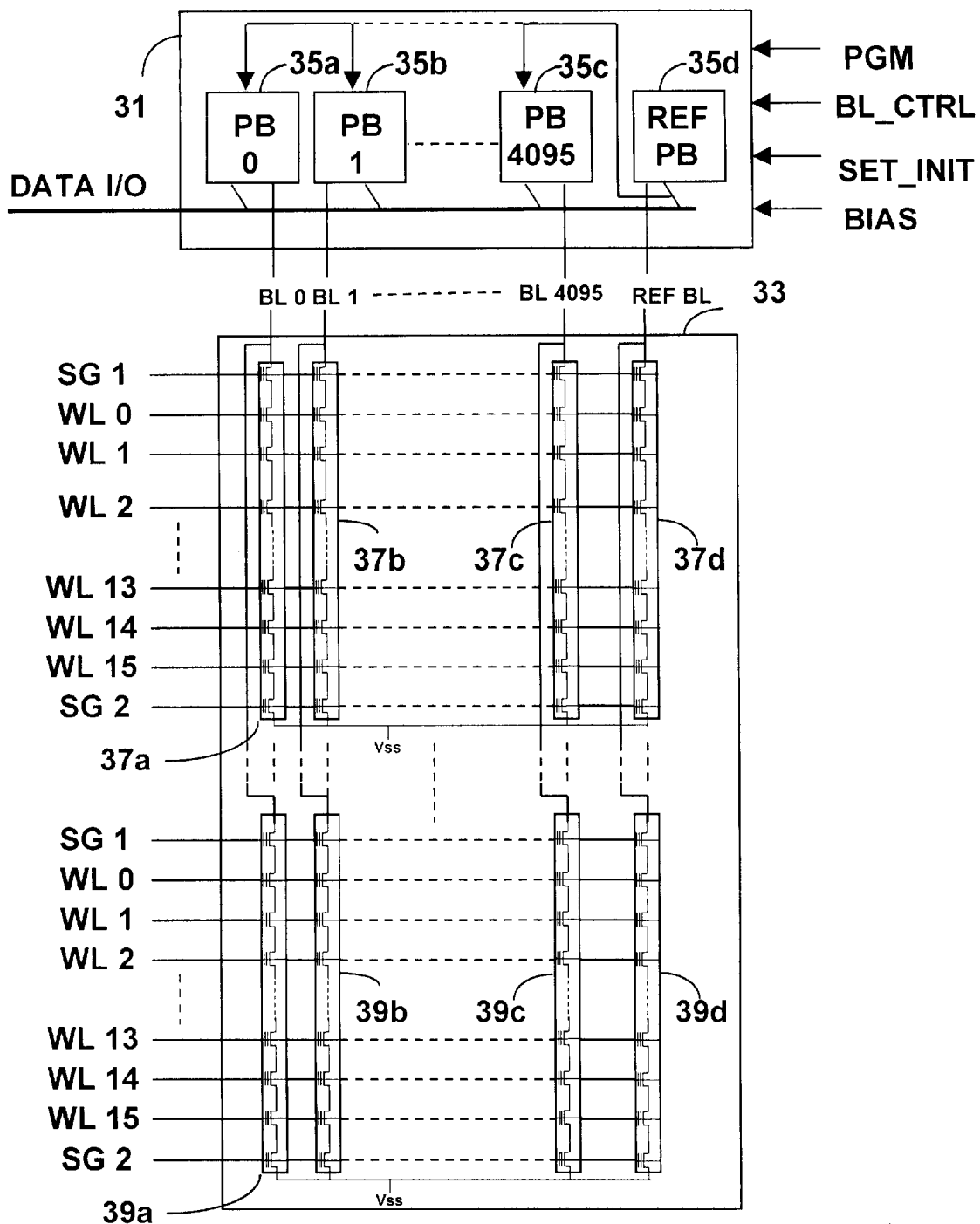
FIG. 2 is a block diagram of a memory cell array and an associated data register and sense amplifier circuit.

FIG. 2 is a block diagram of a memory cell array 33 having 4096 columns of memory cells, and a representation of a data register and sense amplifier circuit 31 containing page buffers. Each column of memory cells is associated with a corresponding bit line. Each bit line is coupled to a corresponding page buffer. The memory cell array 33 also includes a column of reference memory cells. The column of reference memory cells is associated with a reference bit line, which is coupled to a reference page buffer 35d. The memory cell array 33 may further include additional columns of memory cells. The data register and sense amplifier circuit 31 may further include additional page buffers that are associated with the additional columns of memory cells.

In the described embodiment, as shown in FIG. 1, there are actually two data register and sense amplifier circuits 3 and 5. The first data register and sense amplifier circuit 3 includes page buffers associated with the first group of 2048 columns of memory cells, and the second data register and sense amplifier circuit 5 includes page buffers associated with the second group of 2048 columns of memory cells.

For clarity of description, the data register and sense amplifier circuit 31 represents a combination of both the first and the second data register and sense amplifier circuits 3 and 5. Thus, the data register and sense amplifier circuit 31 of FIG. 2 includes all 4096 page buffers, each page buffer being associated with one of the 4096 columns of memory cells, from both the first and the second data register and sense amplifier circuits.

The memory cells in the memory cell array are organized into memory cell strings 37a–c and 39a–c. In one embodiment of the present invention, each memory cell string includes sixteen memory cells, a first select gate transistor and a second select gate transistor. In each memory cell string, the memory cells and the first and second select gate transistors are coupled in series.

The first and second select gate transistors, respectively, are at the beginning and the end of each memory cell string. The first select gate transistor receives a first select gate signal SG 1, and turns on upon assertion of the first select gate signal SG 1. When the first select gate transistor of a particular memory cell string is turned on, that particular memory cell string is selected for communications with the associated page buffer.

The second select gate transistor receives a second select gate signal SG 2 and turns on upon assertion of the second select gate signal SG 2. A source of the second select gate transistor is coupled to a Vss voltage. Thus, when the second select gate transistor of a particular memory cell string is turned on, that particular memory cell string is provided with the Vss voltage.

As shown in the embodiment of FIG. 2, the memory cell array 33 includes 4096 bit lines and a reference bit line. A drain of each of the first select gate transistors is coupled to the bit line associated with the memory cell string that includes the first select gate transistor. The memory cell strings 37a–c represent a first memory cell block comprised of 4096 adjacent memory cell strings. Since there are 1024 memory cell blocks in the flash memory device of the present invention, the memory cell strings 39a–c represent a 1024th memory cell block comprised of 4096 adjacent memory cell strings. Thus, each of the 4096 adjacent memory cell strings in each memory cell block is coupled to the associated one of the 4096 bit lines.

During read and program operations, 4096 memory bits are read or programmed at the same time. A row of memory cells, which is associated with a word line, may be read or programmed at the same time. The row of memory cells that is associated with a word line is also called a page. Thus, there are 16 pages in each memory cell block since there are 16 rows of memory cells.

The first and second x-decoders (shown in FIG. 1) select each memory cell block by providing the select gate signals SG 1 and SG 2, which are applied at the first and second select gate transistors, respectively. Further, the first and second x-decoders select each page in the selected memory cell block by providing appropriate voltages at word lines 1 through 16, each word line being associated with a page. The first x-decoder selects even memory cell block 0, 2, 4 . . . 1022. The second x-decoder selects odd memory cell blocks 1, 3, 5 . . . 1023.

The first and second y-decoders (shown in FIG. 1) select columns, each of which includes 1024 memory cell strings which are coupled together on a bit line. The first y-decoder selects bit lines 0–255, 512–767, 1024–1279, 1536–1791, 2048–2303, 2560–2815, 3072–3327 and 3584–3839. The second y-decoder selects bit line 256–511, 768–1023, 1280–1535, 1792–2047, 2304–2559, 2816–3071, 3328–3583 and 3840–4095.

The data register and sense amplifier circuit 31 receives a program signal PGM, a bit line control signal BL_CTRL, a set initiation signal SET_INIT and a bias signal BIAS from the state machine circuit (shown in FIG. 1). These control signals are provided by the state machine circuit, and are used by the page buffers and the reference page buffer during read, program and verification operations. The reference page buffer 35d receives the set initiation signal SET_INIT from the state machine circuit and provides a set signal to each of the page buffers 35a–c.

Figure 3:
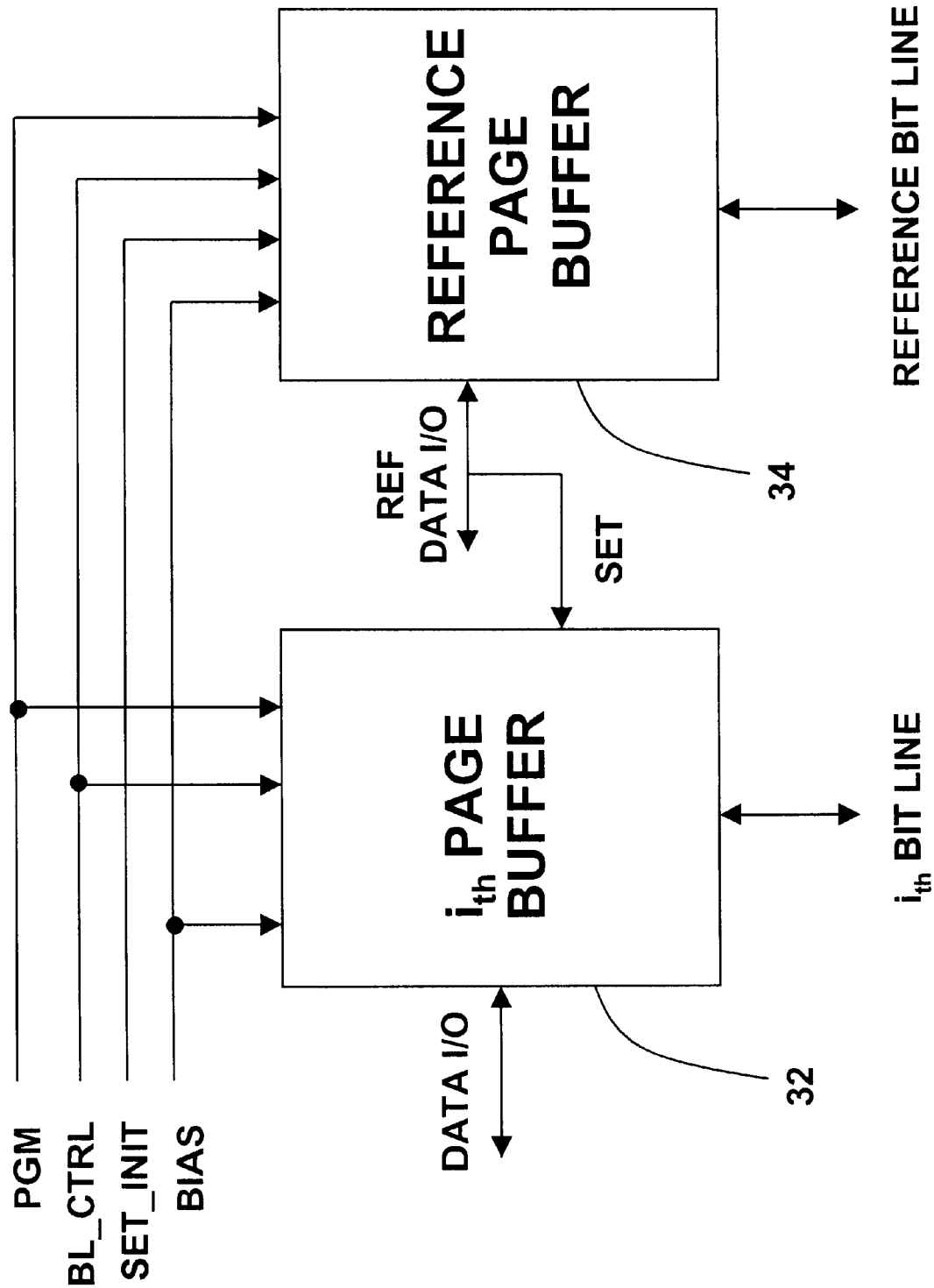
FIG. 3 is a block diagram that shows interface between a reference page buffer and an $i^{th}$ page buffer.

FIG. 3 is a block diagram illustrating an interface between an $i^{th}$ page buffer 32 and the reference page buffer 34. Both the $i^{th}$ page buffer and the reference page buffer receive the program signal PGM, the bit line control signal BL_CTRL and the bias signal BIAS. The reference page buffer also receives the set initiation signal SET_INIT. The reference page buffer generates a set signal SET which is provided to the $i^{th}$ page buffer. The $i^{th}$ page buffer and the reference page buffer are coupled to an $i^{th}$ bit line and the reference bit line, respectively. The $i^{th}$ page buffer serves as an interface between the $i^{th}$ bit line and the I/O register and buffer over the data I/O interface. Similarly, the reference page buffer serves as an interface between the reference bit line and the I/O register and buffer over the reference data I/O interface.

Figure 4:
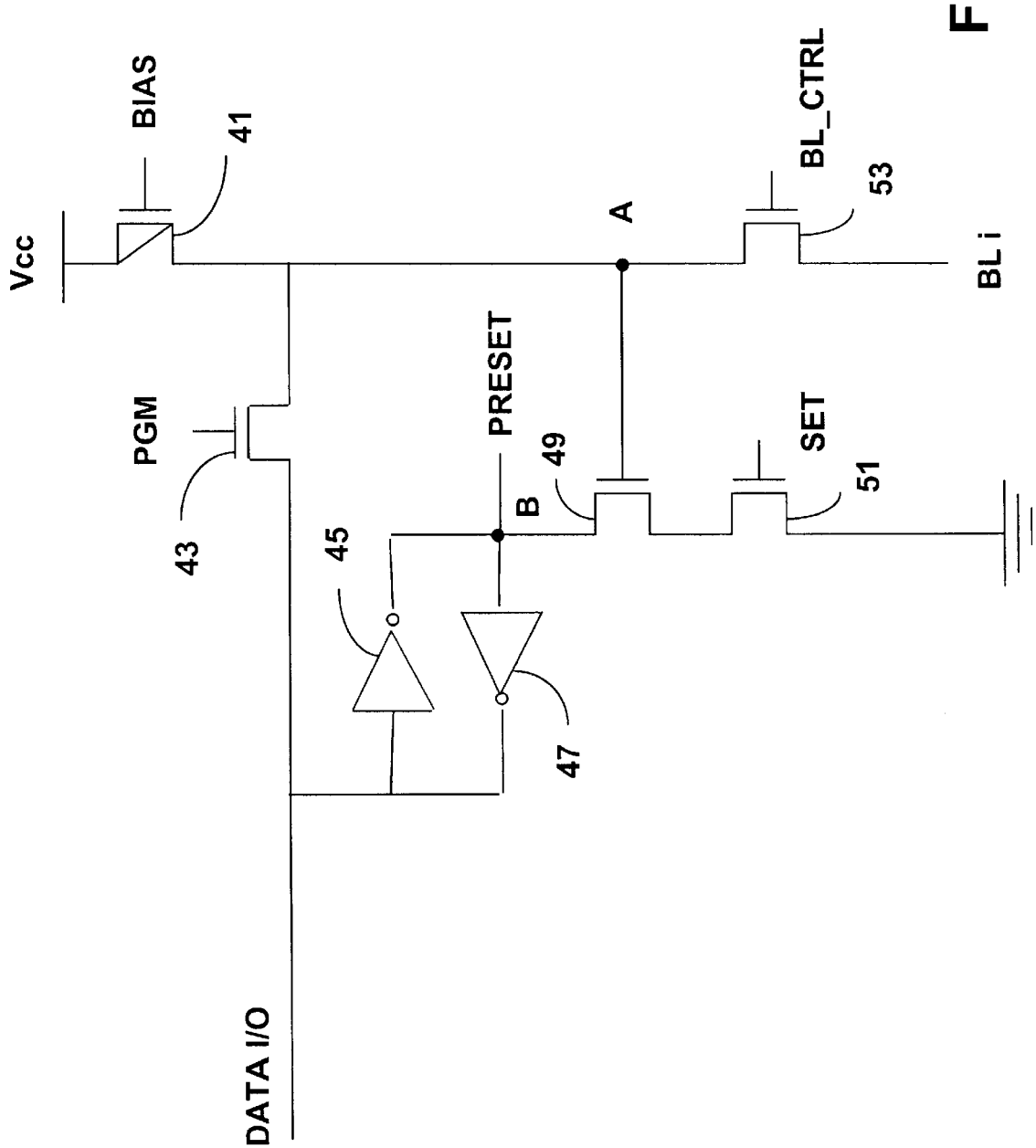
FIG. 4 is a page buffer associated with an $i^{th}$ bit line of the data register and sense amplifier circuit.

FIG. 4 is a page buffer associated with an $i^{th}$ bit line BL i. A drain of a bias transistor 41 is coupled to Vcc. A gate of the bias transistor 41 is coupled to the bias signal BIAS. A source of the bias transistor is coupled to the $i^{th}$ bit line BL i. Accordingly, the bias signal BIAS controls a magnitude of a current flowing through the $i^{th}$ bit line BL i. If the bias signal BIAS is not asserted, approximately no current flows through the $i^{th}$ bit line BL i since the bias transistor is then turned off and approximately no current will flow through the bias transistor regardless of the programming status of a selected memory cell. In the described embodiment, the bias signal BIAS is set low when it is asserted since the bias transistor 41 is a p-type transistor.

Each bit line of a NAND type flash memory device is generally coupled to a bit line control transistor which is located between the bit line and an associated page buffer. Thus, a bit line control transistor coupled to a particular bit line is turned on for the read and program operations of memory cells on the particular bit line. Otherwise, if the bit line control transistor is turned off, the associated page buffer is generally unable to perform the read operation or the program operation.

In FIG. 4, a bit line control transistor 53 is located between the $i^{th}$ bit line BL i and the page buffer with a source of the bit line control transistor 53 coupled to the $i^{th}$ bit line BL i and a drain of the bit line control transistor 53 coupled to the source of the bias transistor 41. Thus, the bit line control transistor 53 controls whether the $i^{th}$ bit line BL i is allowed to conduct current. For read and program operations, the bit line control signal BL_CTRL is asserted to turn on the bit line control transistor 53.

The coupling of the source of the bias transistor 41 and the drain of the bit line control transistor 53 form a node A. A data I/O line is coupled to node A via a program transistor 43. Specifically, a source of the program transistor 43 is coupled to the source of the bias transistor 41 at the node A and a drain of the program transistor 43 is coupled to the data I/O line. The program signal PGM is provided to a gate of the program transistor 43.

During a program operation, the program signal PGM is asserted and turns on the program transistor 43. In the described embodiment, the program signal PGM goes high when it is asserted. With appropriate voltages applied to a selected row of memory cells, i.e., a page, data from the I/O register and buffer over a data I/O line is applied to the $i^{th}$ bit line BL i through the program transistor 43 and the control transistor 53 and written to the selected memory cell of the $i^{th}$ bit line BL i on the selected page. The appropriate voltages that should be applied to the memory cells during program operations are well known in the art.

Once the program operation is completed, the data that is written is verified to enhance reliability during a program verification operation. During the program verification operation, the program signal PGM is not asserted. In the described embodiment, the program signal PGM stays low when it is not asserted.

A set transistor 51, a threshold transistor 49 and inverters 45, 47 are used during the program verification operation and the erase verification operation to check whether programming or erasing, respectively, has been performed satisfactorily. A source of the set transistor 51 is coupled to a Vss voltage and a gate of the set transistor receives the set signal SET. When the set signal SET is asserted, the set transistor 51 is turned on and the Vss voltage is applied to a source of the threshold transistor 49 which is coupled to a drain of the set transistor 51. In the described embodiment, the set signal SET stays high when it is asserted.

A drain of the threshold transistor 49, which forms a node B, is coupled to an input of the inverter 47 and an output of the inverter 45. An output of the inverter 47 is coupled to an input of the inverter 45. Thus, the inverters 45 and 47 form a latch. Prior to the program verification operation or the erase verification operation, the latch is preset to a logic high at node B by applying a logic high preset voltage PRESET. Thus, the data I/O line has an output of a logic low. In actuality, the data I/O line is coupled to an inverter (not shown), and therefore, the data received by the I/O register and buffer is a logic high when node B is at a logic high.

By providing the inverter on the data I/O line, non-inverted data is provided to the I/O register and buffer. For example, suppose a particular memory cell is not programmed, i.e., the particular memory cell contains a logic high. As explained in detail below, node B of the page buffer becomes a logic high when the page buffer reads the particular memory cell. Thus, an output of a latch coupled at an input to node B becomes a logic low. The inverter is provided, therefore, at the output of the latch to re-invert the inverted data from the particular memory cell. Thus, the non-inverted data from the particular memory cell is provided to the I/O register and buffer.

Both the bias transistor 41 and the bit line control transistor 53 are turned on during the program and erase verification operations. If a selected memory cell during the program verification operation does not contain any charge, i.e., the memory cell is erased or not programmed, a current flows through the $i^{th}$ bit line BL i. Similarly during the erase verification operation, if all the memory cells of a selected memory cell block on the $i^{th}$ bit line BL i have been erased successfully, i.e., discharged of electrons, a current flows through the $i^{th}$ bit line BL i.

In those cases, a threshold voltage node A between the source of the bias transistor 41 and the drain of the bit line control transistor 53 is pulled low since there is a voltage drop across the bias transistor 41. Thus, the voltage at the threshold voltage node A will be insufficient to turn on the threshold transistor 49. If the threshold transistor 49 is not turned on, the Vss voltage from the set transistor 51 is not applied at node B. Therefore during the program verification operation, when the selected memory cell has not been programmed, a content of the latch at node B remains the same and the data I/O line provides a logic high to the I/O register and buffer through an inverter (not shown). Similarly during the erase verification operation, when all the memory cells of a bit line in a memory cell block have been erased, the data I/O line provides a logic high to the I/O register and buffer through an inverter (not shown).

If the selected memory cell is programmed, no current flows through the $i^{th}$ bit line BL i during the program verification operation. Similarly, if one or more memory cell of a selected memory cell block on the $i^{th}$ bit line BL i has not been erased successfully, no current flows through the $i^{th}$ bit line BL i during the erase verification operation.

In those cases, the threshold voltage node A between the source of the bias transistor 41 and the drain of the bit line control transistor 53 is pulled high since there is no voltage drop across the bias transistor 41. Thus, the voltage at the threshold voltage node A will be sufficient to turn on the threshold transistor 49. When the threshold transistor 49 is turned on, the Vss voltage from the set transistor 51 is applied at node B. Therefore, when the selected memory cell has been programmed, the content of the latch at node B changes to a logic low and the data I/O line provides a logic low to the I/O register and buffer through the inverter (not shown).

If a correctly programmed memory cell is selected for verification, after a sufficient time elapses following a turnon of the bias transistor 41 and the bit line control transistor 53, the voltage at the threshold node A reaches a threshold voltage level that is enough to turn on the threshold transistor 49. The sufficient time required for the threshold node A to reach the threshold voltage level is dependent on such factors as temperature and a relative position of the selected memory cell within the memory cell array.

Therefore, in the present invention, the set signal SET is asserted when a pre-programmed memory cell which is positioned similarly to the selected memory cell is accurately measured. In other words, in the present invention, the set signal SET is provided to the set transistor 51 after a sufficient time is allowed for an accurate measurement of the pre-programmed memory cell which is similarly positioned as the selected memory cell.

Figure 5:
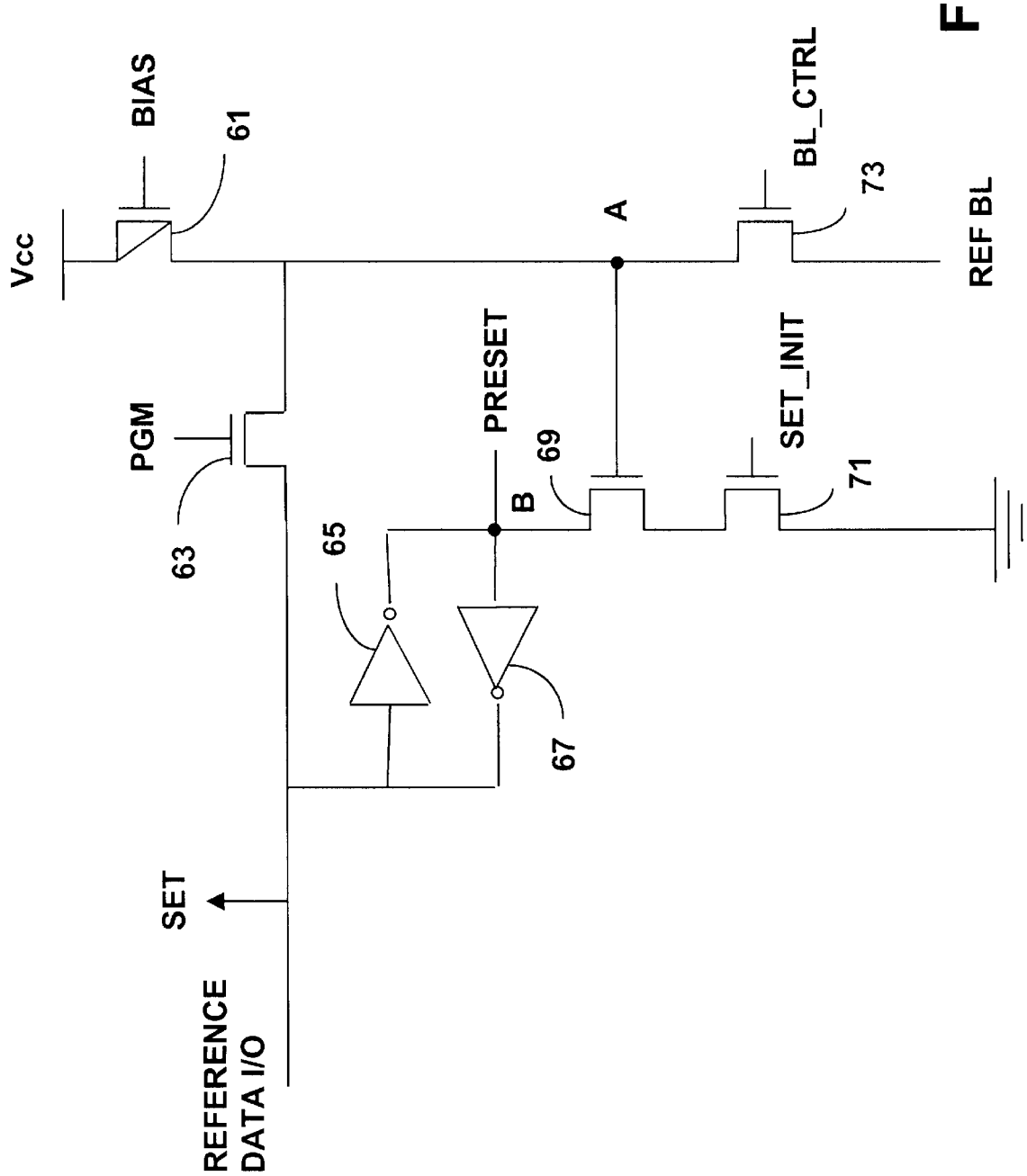
FIG. 5 is a page buffer associated with a reference bit line of the data register and sense amplifier circuit.

In one embodiment of the present invention, the set signal SET is provided by a reference page buffer associated with a reference bit line REF BL. The reference page buffer is shown in FIG. 5. A structure of the reference page buffer is similar to a structure of the page buffer associated with the $i^{th}$ bit line BL i. The reference page buffer includes a bias transistor 61, a program transistor 63, inverters 65, 67, a threshold transistor 69, a set initiation transistor 71 and the bit line control transistor 73.

Unlike the set transistor of the page buffer associated with the $i^{th}$ bit line, the set initiation transistor 71 receives a set initiation signal SET_INIT from the state machine circuit (shown in FIG. 1). The set initiation signal SET_INIT is generated by the state machine circuit and provided to the set initiation transistor shortly after the end of the program operation. The state machine circuit generates the set initiation signal SET_INIT when a program operation is completed and a program voltage applied at a word line is reduced to a program verification voltage. Similar to the case of the $i^{th}$ bit line, the latch including inverters 65 and 67 is preset to a logic high using a preset signal PRESET at node B between an output of the inverter 65 and a drain of the threshold transistor 69.

The set signal SET, therefore, is preset to a logic low since the logic high voltage at node B is inverted by the inverter 67 before being provided as the set signal SET. A reference memory cell at the word line on the reference bit line is pre-programmed to a logic low, i.e., the floating gate of the reference memory cell has been negatively charged with electrons. Thus, a voltage level at the threshold voltage node A between a source of a bias transistor 61 and a drain of a bit line control transistor 73 will reflect the condition of a programmed memory cell. In other words, since a floating gate of the reference memory cell has been negatively charged, no current will flow on the reference bit line. When no current flows on the reference bit line, there is approximately no voltage drop across the bias transistor 61. With no voltage drop across the bias transistor 61, the voltage level at the threshold voltage node A approaches Vcc. Thus, a threshold transistor 69 receives a voltage at the gate that is sufficient to turn on the threshold transistor 69.

Therefore, when the set initiation signal SET_INIT is applied at the gate of the set initiation transistor 71 and the sufficiently high voltage is applied at the gate of the threshold transistor 69, the Vss voltage is applied at node B and the output of the inverter 67 will be a logic high. This output of the inverter 67 is the set signal SET which is provided to the set transistor 51 (shown in FIG. 4) to initiate program or erase verification operation. Thus, the timing of program verification operation or erase verification operation is controlled by the set initiation signal provided to the reference page buffer, and more importantly, by a programmed reference memory cell sensing time of the reference page buffer.

Figure 6:
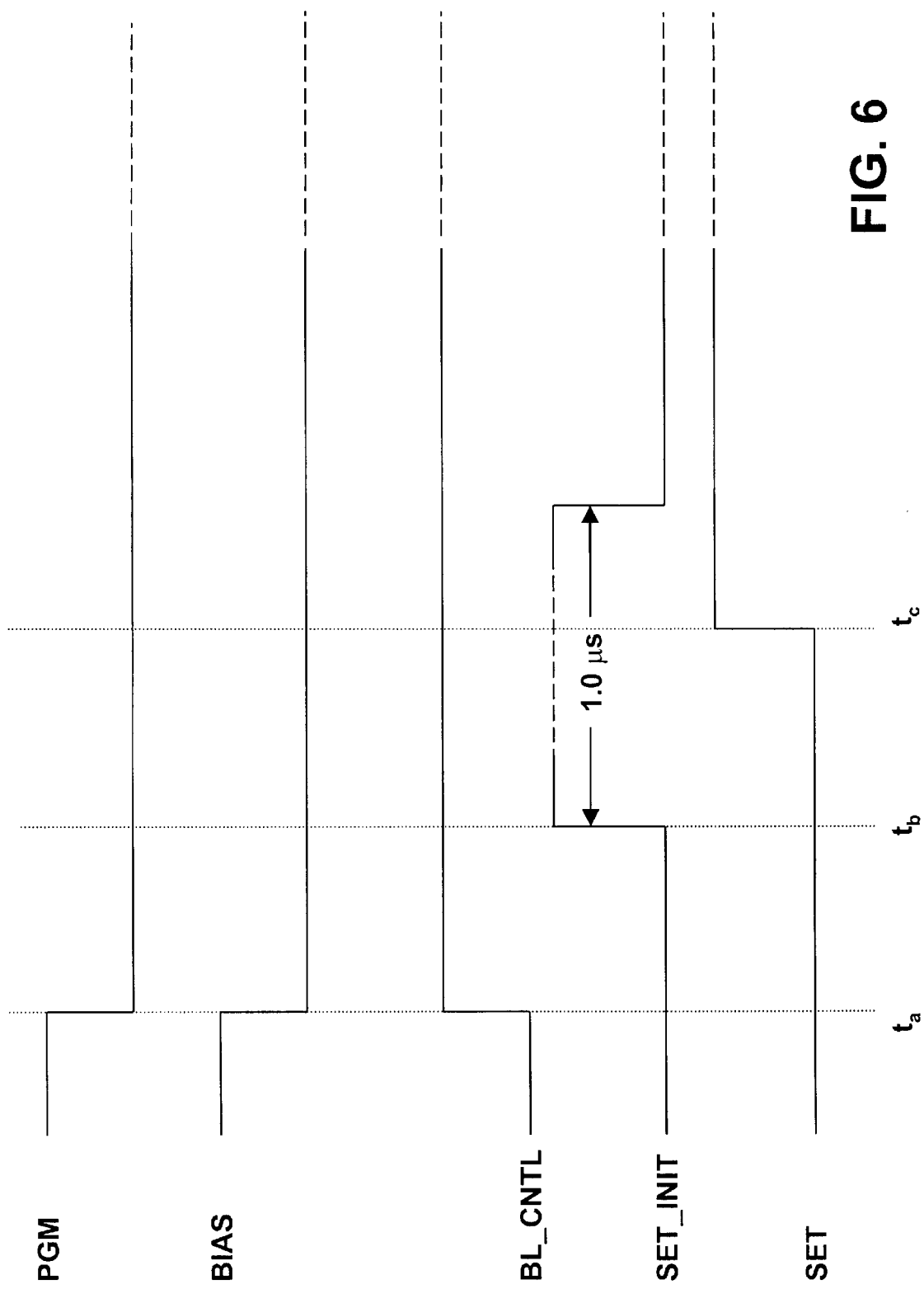
FIG. 6 is a timing diagram that shows voltage level changes of different signals with respect to each other during a program verification operation.

FIG. 6 is a timing diagram which shows relative timing of voltage transitions between different signals used during a program verification operation. During a program operation, the program signal PGM stays at a logic high. Upon completion of the program operation at time $t_a$, the state machine circuit lowers the level of the program signal to a logic low. With the logic low being applied at the gate of the program transistor, the voltage level at the threshold voltage node A is dependent upon statuses of the bias signal BIAS, the bit line control signal BL_CTRL and the floating gate of the memory cell on the bit line of the selected word line.

When the program signal PGM goes to a logic low at time $t_a$, the bias signal BIAS reaches a logic low as well. Since the bias transistor of a page buffer is a p-type transistor, the logic low bias signal BIAS applied at the gate of the bias transistor turns on the bias transistor, making it ready for a current to flow through. If no current flows through the bias transistor when it is turned on, voltage at the source of the bias transistor, and therefore the threshold voltage node A, approaches the level of voltage Vcc applied at the gate of the bias transistor. However, when current flows through the bias transistor, a voltage drop across it prevents the voltage at the threshold voltage node A from approaching Vcc.

As the bias transistor turns on at time $t_a$, the bit line control signal BL_CTRL goes high and turns on the bit line control transistor. If the respective memory cell has been programmed, no current flows through the bit line and the voltage level at the threshold voltage node A approaches Vcc. If the respective memory cell has not been programmed, a current flows through the bit line and the voltage level at the threshold voltage node A does not approach Vcc.

Both the bias signal BIAS and the bit line control signal BL_CTRL are applied at both the data bit lines and the reference bit line substantially simultaneously. Therefore, the threshold voltage at the threshold voltage node A for both the data bit lines and the reference bit line would be adjusted at the same time. The set initiation signal SET_INIT is applied at the set transistor of the reference page buffer at time $t_b$. The set initiation signal SET_INIT is a pulse of about 1.0 μs in duration as shown in FIG. 6. With the pulse held high, once the threshold voltage at the threshold voltage node A reaches a sufficient level to turn on the threshold transistor of the reference page buffer, the set signal SET is generated by the reference page buffer at time $t_c$.

With the assertion of the set signal SET at the gate of the set transistor of the page buffer associated with a bit line, if the corresponding memory cell has been programmed, the threshold voltage at the threshold voltage node A will be reached and the data I/O line associated with the page buffer will be switched to a logic high. If, however, the corresponding memory cell has not been programmed, the threshold transistor does not turn on and the latches will remain at the preset value where it has been preset to a logic high at node B, and therefore a logic low at the data I/O line.

Thus, during the program verification operation, the content of a respective memory cell is stored in the latch including the inverters 45 and 47. The content of the latch at the node B (shown in FIG. 4) in each page buffer is then compared with the data in the I/O register and buffer. If the contents of the latches in the data register and sense amplifier circuit match the contents of the I/O register and buffer, the program operation has been completed successfully and no further programming is needed. Otherwise, the page that failed to pass the program verification operation is re-programmed.

Similarly, during the erase verification operation, contents of the latches at the node B are verified to be in a logic high state. If the node B of any of the page buffers is in a logic low state, an erase operation has failed for one or more memory cells associated with that page buffer, and the erase verification operation fails. Accordingly, an erase operation is performed once again for that memory cell block.

Figure 7:
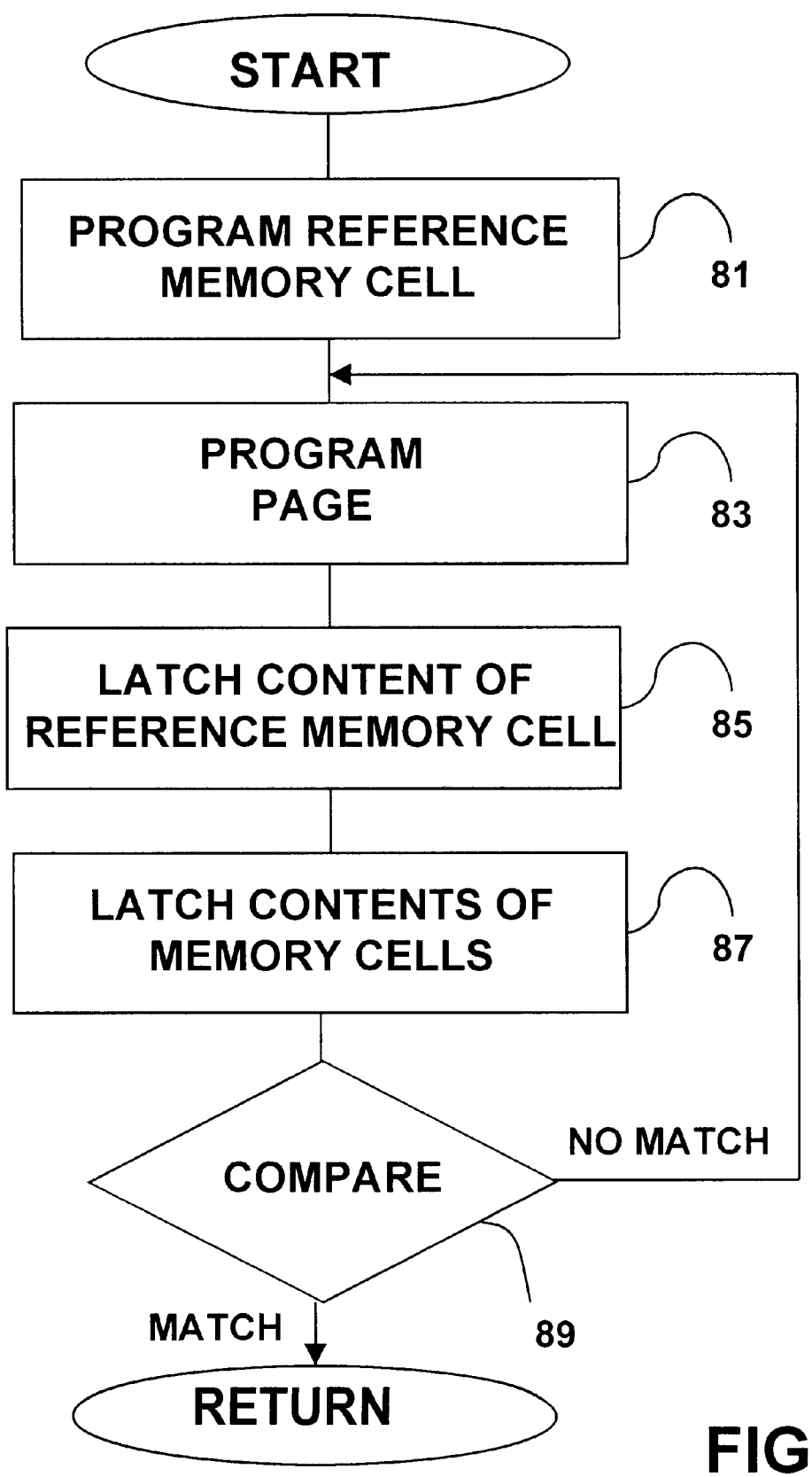
FIG. 7 is a flow diagram of a process of performing a program verification operation.

FIG. 7 is a flow diagram of a process of programming and verifying a page of memory cells. The process in step 81 programs a reference memory cell to a charged status. The process in step 83 programs a page during one program operation. The process in step 85 latches a content of the reference memory cell programmed in step 81 and outputs the content as the set signal. The set signal generated in step 85 is used by the process in step 87 to latch the contents of the memory cells in the page programmed in step 83.

The process in step 89 compares the contents of the latches of the page buffers against corresponding data stored in the I/O register and buffer for verification of programming. If the contents of the page buffers match the corresponding data, the process returns. If the content of any page buffer does not match the corresponding data, the process once again performs the program operation of the page of step 83 and the steps for program verification.

Accordingly, the present invention provides a sensing time control device and method for reducing data sensing latency and improving data sensing reliability. Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents rather than the foregoing description.

What is claimed is:

1. A method of performing a program verification operation comprising:

programming a reference memory cell, the reference memory cell corresponding to a page in a memory cell block of a NAND type flash memory, the memory cell block comprising a plurality of pages, and one reference memory cell being provided for each page;

programming a memory cell on the same page as the programmed reference memory cell;

generating a set signal using a content of the reference memory cell; and using the set signal to initiate the program verification operation for the memory cell.

2. The method of performing a program verification operation of claim 1 wherein the programmed reference memory cell is programmed to a negatively charged state.

3. The method of performing a program verification operation of claim 1 wherein the programmed reference memory cell is programmed to regular programming state.

4. The method of performing a program verification operation of claim 1 wherein a reference page buffer is coupled to the programmed reference memory cell and a data page buffer is coupled to the memory cell, the reference page buffer is used to read and store a content of the reference memory cell and the data page buffer is used to read and store a content of the programmed memory cell.

5. The method of performing a program verification operation of claim 4 wherein generating the set signal with the content of the programmed reference memory cell comprises providing a set initiation signal to the reference page buffer to store the content of the programmed reference memory cell as a content of the reference page buffer and outputting the content of the reference page buffer as the set signal.

6. The method of performing a program verification operation of claim 4 wherein using the set signal to initiate the program verification operation of the memory cell comprises providing the set signal to the data page buffer to store the content of the memory cell as a content of the data page buffer.

7. The method of performing a program verification operation of claim 6 further comprising comparing the content of the data page buffer with a corresponding content of an I/O register and buffer.

8. The method of performing a program verification operation of claim 7 further comprising re-programming the memory cell, re-generating the set signal with the content of the programmed reference memory cell and using the set signal to initiate another program verification operation of the memory cell, when the content of the data page buffer does not match the corresponding content of the I/O register and buffer.

9. The method of performing a program verification operation of claim 1 further comprising programming a plurality of memory cells on the same page as the programmed reference memory cell; and using the set signal to initiate the program verification operation for the plurality of memory cells.

10. The method of performing a program verification operation of claim 9 wherein the programmed reference memory cell is programmed to a negatively charged state.

11. The method of performing a program verification operation of claim 9 wherein the programmed reference memory cell is coupled to a reference page buffer and each of the plurality of memory cells is coupled to a corresponding one of a plurality of data page buffers, the reference page buffer is used to read and store a content of the programmed reference memory cell and each of the plurality of data page buffers is used to read and store a content of the corresponding one of the plurality of memory cells.

12. The method of performing a program verification operation of claim 11 wherein generating the set signal with the content of the programmed reference memory cell comprises providing a set initiation signal to the reference page buffer to store the content of the programmed reference memory cell as a content of the reference page buffer and outputting the content of the reference page buffer as the set signal.

13. The method of performing a program verification operation of claim 11 wherein using the set signal to initiate the program verification operation of the plurality of memory cells comprises providing the set signal to each of the plurality of data page buffers to store the content of the corresponding one of the plurality of memory cells as a content of each of the plurality of data page buffers.

14. The method of performing a program verification operation of claim 13 further comprising comparing the contents of the plurality of data page buffers with corresponding contents of an I/O register and buffer.

15. The method of performing a program verification operation of claim 14 further comprising re-programming the plurality of memory cells, re-generating the set signal with the content of the programmed reference memory cell and using the set signal to initiate another program verification operation of the plurality of memory cells, when at least one of the contents of the plurality of data page buffers does not match the corresponding content of the I/O register and buffer.

16. A method of performing an erase verification operation comprising:
   programming a reference memory cell, the reference memory cell corresponding to a page in a memory cell block of a NAND type flash memory, the memory cell block comprising a plurality of pages, and one reference memory cell being provided for each page;
   erasing a memory cell on the same page as the programmed reference memory cell;
   generating a set signal using a content of the reference memory cell; and
   using the set signal to initiate the erase verification operation for the memory cell.

17. The method of performing an erase verification operation of claim 16 wherein the programmed reference memory cell is programmed to a negatively charged state.

18. The method of performing an erase verification operation of claim 16 wherein a reference page buffer is coupled to the programmed reference memory cell and a data page buffer is coupled to the memory cell, the reference page buffer is used to read and store a content of the programmed reference memory cell and the data page buffer is used to read and store a content of the memory cell.

19. The method of performing an erase verification operation of claim 18 wherein generating the set signal with the content of the programmed reference memory cell comprises providing a set initiation signal to the reference page buffer to store the content of the programmed reference memory cell as a content of the reference page buffer and outputting the content of the reference page buffer as the set signal.

20. The method of performing an erase verification operation of claim 18 wherein using the set signal to initiate the erase verification operation of the memory cell comprises providing the set signal to the data page buffer to store the content of the memory cell as a content of the data page buffer.

21. The method of performing an erase verification operation of claim 20 further comprising checking the content of the data page buffer to determine whether or not the memory cell is in a discharged state.

22. The method of performing an erase verification operation of claim 21 further comprising re-erasing the memory cell, re-generating the set signal with the content of the programmed reference memory cell and using the set signal to initiate another erase verification operation of the memory cell, when the content of the data page buffer indicates that the memory cell is in a negatively charged state.

23. The method of performing an erase verification operation of claim 16 further comprising erasing a plurality of memory cells on the same page as the programmed reference memory cell; and using the set signal to initiate the erase verification operation for the plurality of memory cells.

24. The method of performing an erase verification operation of claim 23 wherein the programmed reference memory cell is programmed to a negatively charged state.

25. The method of performing an erase verification operation of claim 23 wherein the programmed reference memory cell is coupled to a reference page buffer and each of the plurality of memory cells is coupled to a corresponding one of a plurality of data page buffers, the reference page buffer is used to read and store a content of the programmed reference memory cell and each of the plurality of data page buffers is used to read and store a content of the corresponding one of the plurality of memory cells.

26. The method of performing an erase verification operation of claim 25 wherein generating the set signal with the content of the reference memory cell comprises providing a set initiation signal to the reference page buffer to store the content of the programmed reference memory cell as a content of the reference page buffer and outputting the content of the reference page buffer as the set signal.

27. The method of performing an erase verification operation of claim 25 wherein using the set signal to initiate the erase verification operation of the plurality of memory cells comprises providing the set signal to each of the plurality of data page buffers to store the content of the corresponding one of the plurality of memory cells as a content of each of the plurality of data page buffers.

28. The method of performing an erase verification operation of claim 27 further comprising checking the content of each of the plurality of data page buffers to determine whether or not the corresponding one of the plurality of memory cells is in a discharged state.

29. The method of performing an erase verification operation of claim 28 further comprising re-erasing the plurality of memory cells, re-generating the set signal with the content of the programmed reference memory cell and using the set signal to initiate another erase verification operation of the plurality of memory cells, when the contents of the plurality of data page buffers indicate that at least one of the plurality of memory cells is in a negatively charged state.

30. A method of verifying a content of a memory cell in a memory cell block of a NAND type flash memory, the memory cell block comprising a plurality of pages, and one reference memory cell being provided for each page comprising:
   programming a reference memory cell on the same page of the memory cell block in the NAND type flash memory as the memory cell;
   sensing a content of the programmed reference memory cell; and
   verifying the content of the memory cell when the content of the programmed reference memory cell has been sensed.

31. A method of providing a set signal to a page buffer associated with a memory cell in a memory cell block of a NAND type flash memory, the memory cell block comprising a plurality of pages, and one reference memory cell being provided for each page, the method comprising:
   programming a reference memory cell coupled to a reference page buffer, the programmed reference memory cell being in the same page of the memory cell block in the NAND type flash memory as the memory cell;
   setting a voltage of a node in the reference page buffer based on the content of the programmed reference memory cell;
   and providing the voltage at the node to the page buffer as the set signal.

32. The method of providing a set signal to a page buffer associated with a memory cell of claim 31 further comprising:
   presetting the voltage at the node to a logic high,
   wherein the step of setting the voltage of the node comprises setting the voltage at the node to a logic low.

33. The method of providing a set signal to a page buffer associated with a memory cell of claim 31 wherein the step of providing the voltage at the node to the page buffer as the set signal comprises the steps of inverting the voltage at the node and providing the inverted voltage to the page buffer as the set signal.

34. A sensing time control circuit for use in NAND type flash memory, the sensing time control circuit comprising:
a reference page buffer which receives a set initiation signal and generates a set signal using a content of one reference memory cell provided for a page of a memory cell block in the NAND type flash memory; and
a plurality of data page buffers that receive the set signal and store contents of a plurality of memory cells in the same page as the one reference memory cell, each of the plurality of data page buffers storing a content of an associated one of the plurality of memory cells.

35. The sensing time control circuit of claim 34 wherein the reference page buffer comprises a set initiation transistor receiving the set initiation signal and turning on upon receiving the set initiation signal and a latch coupled to the set initiation transistor, the latch providing the set signal.

36. The sensing time control circuit of claim 34 wherein each of the plurality of reference page buffers comprises a set transistor receiving the set signal and turning on upon receiving the set signal and a latch coupled to the set transistor, the latch providing a content to an associated memory cell.

* * * * *